(12) United States Patent
Rofougaran

(10) Patent No.: US 8,743,002 B2
(45) Date of Patent: Jun. 3, 2014

(54) METHOD AND SYSTEM FOR A 60 GHZ LEAKY WAVE HIGH GAIN ANTENNA

(75) Inventor: Ahmadreza Rofougaran, Newport Coast, CA (US)

(73) Assignee: Broadcom Corporation, Irvine, CA (US)

( * ) Notice: Subject to any disclaimer, the term of this patent is extended or adjusted under 35 U.S.C. 154(b) by 1033 days.

(21) Appl. No.: 12/708,366

(22) Filed: Feb. 18, 2010

(65) Prior Publication Data

US 2010/0309071 A1 Dec. 9, 2010

Related U.S. Application Data

(60) Provisional application No. 61/246,618, filed on Sep. 29, 2009, provisional application No. 61/185,245, filed on Jun. 9, 2009.

(51) Int. Cl.
*H01Q 13/00* (2006.01)

(52) U.S. Cl.
USPC .......................................... 343/772; 343/776

(58) Field of Classification Search
USPC ................................................ 343/772, 776
See application file for complete search history.

(56) References Cited

U.S. PATENT DOCUMENTS

| | | |
|---|---|---|
| 3,972,049 A | 7/1976 | Kaloi |
| 4,078,237 A | 3/1978 | Kaloi |
| 4,701,763 A | 10/1987 | Yamamoto |
| 5,138,436 A | 8/1992 | Koepf |
| 5,300,875 A | 4/1994 | Tuttle |
| 5,363,075 A | 11/1994 | Fanucchi |
| 5,387,885 A | 2/1995 | Chi |
| 5,717,943 A | 2/1998 | Barker |
| 5,812,933 A | 9/1998 | Niki |
| 5,900,843 A | 5/1999 | Lee |
| 5,912,598 A | 6/1999 | Stones |
| 5,943,025 A | 8/1999 | Benham |
| 6,005,520 A | 12/1999 | Nalbandian |
| 6,037,743 A | 3/2000 | White |
| 6,127,799 A | 10/2000 | Krishnan |
| 6,212,431 B1 | 4/2001 | Hahn |

(Continued)

OTHER PUBLICATIONS

Iyer et al., "Wireless chip to chip interconnections for multichip modules using leaky wave antennas", Nov. 1993, pp. 2030-2031.

(Continued)

*Primary Examiner* — Dameon Levi
*Assistant Examiner* — Collin Dawkins
(74) *Attorney, Agent, or Firm* — Oblon, Spivak, McClelland, Maier & Neustadt, L.L.P.

(57) ABSTRACT

Methods and systems for a 60 GHz leaky wave high gain antenna are disclosed and may include communicating RF signals using one or more or more leaky wave antennas (LWAs) in a wireless device. The LWAs may be integrated in metal traces on a chip, a package, and/or a printed circuit board (PCB). The metal traces may supply voltage signals to one or more circuits on the chip, package, and/or PCB. The voltage signals may include DC bias voltages, and/or signals at a frequency that is lower than a resonant frequency of the LWAs. The LWAs may include microstrip or coplanar lines where a cavity height of the LWAs is dependent on a spacing between the lines. An angle of the wireless signals with a surface of the chip, package, and/or PCB may be dynamically configured. The LWAs may be configured via switches in the chip, package, and/or PCB.

20 Claims, 10 Drawing Sheets

(56) References Cited

U.S. PATENT DOCUMENTS

| | | | |
|---|---|---|---|
| 6,285,325 B1 | 9/2001 | Nalbandian | |
| 6,317,095 B1 | 11/2001 | Teshirogi | |
| 6,339,402 B1 | 1/2002 | McKivergan | |
| 6,380,883 B1 | 4/2002 | Bell | |
| 6,404,390 B2 | 6/2002 | Sheen | |
| 6,597,323 B2* | 7/2003 | Teshirogi et al. | 343/786 |
| 6,603,915 B2 | 8/2003 | Glebov | |
| 6,735,630 B1 | 5/2004 | Gelvin | |
| 6,771,935 B1 | 8/2004 | Leggett | |
| 6,841,981 B2 | 1/2005 | Smith | |
| 6,954,236 B1 | 10/2005 | Russell | |
| 7,002,517 B2* | 2/2006 | Noujeim | 343/700 MS |
| 7,020,701 B1 | 3/2006 | Gelvin | |
| 7,023,374 B2 | 4/2006 | Jossef | |
| 7,084,823 B2 | 8/2006 | Caimi | |
| 7,233,299 B2 | 6/2007 | Thevenot | |
| 7,242,368 B2 | 7/2007 | Thevenot | |
| 7,253,780 B2* | 8/2007 | Sievenpiper | 343/745 |
| 7,268,517 B2 | 9/2007 | Rahmel | |
| 7,271,680 B2 | 9/2007 | Hall | |
| 7,317,342 B2 | 1/2008 | Saint-Laurent | |
| 7,330,090 B2 | 2/2008 | Itoh | |
| 7,348,928 B2 | 3/2008 | Ma | |
| 7,373,133 B2 | 5/2008 | Mickle | |
| 7,388,557 B2 | 6/2008 | Jecko | |
| 7,394,288 B1 | 7/2008 | Agarwal | |
| 7,411,564 B2 | 8/2008 | Thevenot | |
| 7,535,958 B2 | 5/2009 | Best | |
| 7,592,957 B2 | 9/2009 | Achour | |
| 7,620,424 B2 | 11/2009 | Cetiner | |
| 7,733,265 B2 | 6/2010 | Margomenos | |
| 7,830,220 B2 | 11/2010 | Ceylan | |
| 7,855,696 B2 | 12/2010 | Gummalla | |
| 7,982,681 B2 | 7/2011 | Chang | |
| 8,019,293 B2 | 9/2011 | Dagher | |
| 8,195,103 B2 | 6/2012 | Waheed | |
| 8,242,957 B2 | 8/2012 | Rofougaran | |
| 8,285,231 B2 | 10/2012 | Rofougaran | |
| 8,295,788 B2 | 10/2012 | Rofougaran | |
| 8,299,971 B2 | 10/2012 | Talty | |
| 8,457,581 B2 | 6/2013 | Rofougaran | |
| 8,508,422 B2 | 8/2013 | Rofougaran | |
| 2002/0000936 A1 | 1/2002 | Sheen | |
| 2002/0005807 A1 | 1/2002 | Sheen | |
| 2002/0041256 A1 | 4/2002 | Saitou | |
| 2002/0135568 A1 | 9/2002 | Chen | |
| 2003/0122729 A1* | 7/2003 | Diaz et al. | 343/909 |
| 2004/0066251 A1 | 4/2004 | Eleftheriades | |
| 2004/0203944 A1 | 10/2004 | Huomo | |
| 2004/0227668 A1* | 11/2004 | Sievenpiper | 343/700 MS |
| 2004/0263378 A1 | 12/2004 | Jossef | |
| 2004/0263408 A1 | 12/2004 | Sievenpiper | |
| 2005/0012667 A1 | 1/2005 | Noujeim | |
| 2005/0052283 A1 | 3/2005 | Collins | |
| 2005/0052424 A1 | 3/2005 | Shih | |
| 2005/0116864 A1 | 6/2005 | Mohamadi | |
| 2005/0128155 A1 | 6/2005 | Fukuda | |
| 2005/0130700 A1 | 6/2005 | Gardenfors | |
| 2005/0134579 A1 | 6/2005 | Hsieh | |
| 2005/0136972 A1 | 6/2005 | Smith | |
| 2006/0066326 A1 | 3/2006 | Slupsky | |
| 2006/0109127 A1 | 5/2006 | Barink | |
| 2006/0125703 A1 | 6/2006 | Ma | |
| 2006/0125713 A1 | 6/2006 | Thevenot | |
| 2006/0281423 A1 | 12/2006 | Caimi | |
| 2007/0171076 A1 | 7/2007 | Stevens | |
| 2007/0190952 A1 | 8/2007 | Waheed | |
| 2007/0273607 A1* | 11/2007 | Chen | 343/893 |
| 2007/0285248 A1 | 12/2007 | Hamel | |
| 2007/0287403 A1 | 12/2007 | Sjoland | |
| 2008/0068174 A1 | 3/2008 | Al-Mahdawi | |
| 2008/0105966 A1 | 5/2008 | Beer | |
| 2008/0159243 A1 | 7/2008 | Rofougaran | |
| 2008/0231603 A1 | 9/2008 | Parkinson | |
| 2008/0258981 A1 | 10/2008 | Achour | |
| 2008/0278400 A1* | 11/2008 | Lohninger et al. | 343/873 |
| 2008/0284085 A1 | 11/2008 | Curina | |
| 2008/0316135 A1 | 12/2008 | Hilgers | |
| 2009/0066516 A1 | 3/2009 | Lazo | |
| 2009/0108996 A1 | 4/2009 | Day | |
| 2009/0160612 A1 | 6/2009 | Varpula | |
| 2009/0251362 A1 | 10/2009 | Margomenos | |
| 2010/0110943 A2 | 5/2010 | Gummalla | |
| 2010/0176880 A2 | 7/2010 | Dupuy | |
| 2010/0222105 A1 | 9/2010 | Nghiem | |
| 2010/0308668 A1 | 12/2010 | Rofougaran | |
| 2010/0308767 A1 | 12/2010 | Rofougaran | |
| 2010/0308885 A1 | 12/2010 | Rofougaran | |
| 2010/0308970 A1 | 12/2010 | Rofougaran | |
| 2010/0308997 A1 | 12/2010 | Rofougaran | |
| 2010/0309040 A1 | 12/2010 | Rofougaran | |
| 2010/0309056 A1 | 12/2010 | Rofougaran | |
| 2010/0309069 A1 | 12/2010 | Rofougaran | |
| 2010/0309071 A1 | 12/2010 | Rofougaran | |
| 2010/0309072 A1 | 12/2010 | Rofougaran | |
| 2010/0309073 A1 | 12/2010 | Rofougaran | |
| 2010/0309074 A1 | 12/2010 | Rofougaran | |
| 2010/0309075 A1 | 12/2010 | Rofougaran | |
| 2010/0309076 A1 | 12/2010 | Rofougaran | |
| 2010/0309077 A1 | 12/2010 | Rofougaran | |
| 2010/0309078 A1 | 12/2010 | Rofougaran | |
| 2010/0309079 A1 | 12/2010 | Rofougaran | |
| 2010/0309824 A1 | 12/2010 | Rofougaran | |
| 2010/0311324 A1 | 12/2010 | Rofougaran | |
| 2010/0311332 A1 | 12/2010 | Roufougaran | |
| 2010/0311333 A1 | 12/2010 | Rofougaran | |
| 2010/0311338 A1 | 12/2010 | Rofougaran | |
| 2010/0311340 A1 | 12/2010 | Rofougaran | |
| 2010/0311355 A1 | 12/2010 | Rofougaran | |
| 2010/0311356 A1 | 12/2010 | Rofougaran | |
| 2010/0311359 A1 | 12/2010 | Rofougaran | |
| 2010/0311363 A1 | 12/2010 | Rofougaran | |
| 2010/0311364 A1 | 12/2010 | Rofougaran | |
| 2010/0311367 A1 | 12/2010 | Rofougaran | |
| 2010/0311368 A1 | 12/2010 | Rofougaran | |
| 2010/0311369 A1 | 12/2010 | Rofougaran | |
| 2010/0311376 A1 | 12/2010 | Rofougaran | |
| 2010/0311379 A1 | 12/2010 | Rofougaran | |
| 2010/0311380 A1 | 12/2010 | Rofougaran | |
| 2010/0311472 A1 | 12/2010 | Rofougaran | |
| 2010/0311493 A1 | 12/2010 | Miller | |
| 2011/0148723 A1 | 6/2011 | Bengtsson | |
| 2011/0163930 A1 | 7/2011 | De Lustrac | |
| 2012/0095531 A1 | 4/2012 | Derbas | |
| 2012/0153731 A9 | 6/2012 | Kirby | |
| 2012/0263256 A1 | 10/2012 | Waheed | |

OTHER PUBLICATIONS

Huang et al., "An Electronically Switchable Leaky Wave Antenna", Nov. 2000, pp. 1769-1772.

Grbic et al., "Leaky CPW-Based Slot Antenna Arrays for Millimeter-Wave Applications", Nov. 2002, pp. 1494-1504.

Floyd et al., "Wireless Interconnects for Clock Distribution", pp. 105-108.

Zvolensky et al., "Leaky-Wave antenna based on micro-electromechanical systems-loaded microstrip line", 2011, pp. 357-363.

Feresidis et al., "Flat Plate Millimetre Wave Antenna Based on Partially Reflective FSS", 11th International Conference on Antennas and Propagation. 2001, pp. 33-36.

O, K.K. et al., "Silicon Integrated Circuits Incorporating Antennas", IEEE Custom Integrated Circuits Conference, 2006, pp. 473-480.

Sterner et al., "RF MEMS High-Impedance Tuneable Metamaterials for Millimeter-Wave Beam Steering", Micro Electro Mechanical Systems, 2009, pp. 896-899.

Ourir et al., "Electronically Reconfigurable Metamaterial for Compact Directive Cavity Antennas", Electronics Letters, 2007.

Kimoto et al., "On-Chip Wireless Signal Transmission using Silicon Integrated Antennas", Measurement 40, No. 30, (2004): 20.

Yeo et al.. "Novel Design of a High-Gain and Wideband Fabry-Perot Cavity Antenna Using a Tapered AMC Substrate", J Infrared Milli Terahz Waves, (2009) vol. 30. pp. 217-224.

* cited by examiner ns which transmit and/or receive data at frequency ranges around 60 GHz, for example.

METHOD AND SYSTEM FOR A 60 GHZ LEAKY WAVE HIGH GAIN ANTENNA

CROSS-REFERENCE TO RELATED APPLICATIONS/INCORPORATION BY REFERENCE

This application makes reference to, claims the benefit from, and claims priority to U.S. Provisional Application Ser. No. 61/246,618 filed on Sep. 29, 2009, and U.S. Provisional Application Ser. No. 61/185,245 filed on Jun. 9, 2009.

This application also makes reference to:
U.S. patent application Ser. No. 12/650,212 filed on Dec. 30, 2009;
U.S. patent application Ser. No. 12/650,295 filed on Dec. 30, 2009;
U.S. patent application Ser. No. 12/650,277 filed on Dec. 30, 2009;
U.S. patent application Ser. No. 12/650,192 filed on Dec. 30, 2009;
U.S. patent application Ser. No. 12/650,224 filed on Dec. 30, 2009;
U.S. patent application Ser. No. 12/650,176 filed on Dec. 30, 2009;
U.S. patent application Ser. No. 12/650,246 filed on Dec. 30, 2009;
U.S. patent application Ser. No. 12/650,292 filed on Dec. 30, 2009; and
U.S. patent application Ser. No. 12/650,324 filed on Dec. 30, 2009.

Each of the above stated applications is hereby incorporated herein by reference in its entirety.

FEDERALLY SPONSORED RESEARCH OR DEVELOPMENT

[Not Applicable]

FIELD OF THE INVENTION

Certain embodiments of the invention relate to wireless communication. More specifically, certain embodiments of the invention relate to a method and system for a 60 GHz leaky wave high gain antenna.

BACKGROUND OF THE INVENTION

Mobile communications have changed the way people communicate and mobile phones have been transformed from a luxury item to an essential part of every day life. The use of mobile phones is today dictated by social situations, rather than hampered by location or technology. While voice connections fulfill the basic need to communicate, and mobile voice connections continue to filter even further into the fabric of every day life, the mobile Internet is the next step in the mobile communication revolution. The mobile Internet is poised to become a common source of everyday information, and easy, versatile mobile access to this data will be taken for granted.

As the number of electronic devices enabled for wireline and/or mobile communications continues to increase, significant efforts exist with regard to making such devices more power efficient. For example, a large percentage of communications devices are mobile wireless devices and thus often operate on battery power. Additionally, transmit and/or receive circuitry within such mobile wireless devices often account for a significant portion of the power consumed within these devices. Moreover, in some conventional communication systems, transmitters and/or receivers are often power inefficient in comparison to other blocks of the portable communication devices. Accordingly, these transmitters and/or receivers have a significant impact on battery life for these mobile wireless devices.

Further limitations and disadvantages of conventional and traditional approaches will become apparent to one of skill in the art, through comparison of such systems with the present invention as set forth in the remainder of the present application with reference to the drawings.

BRIEF SUMMARY OF THE INVENTION

A system and/or method for a 60 GHz leaky wave high gain antenna, substantially as shown in and/or described in connection with at least one of the figures, as set forth more completely in the claims.

Various advantages, aspects and novel features of the present invention, as well as details of an illustrated embodiment thereof, will be more fully understood from the following description and drawings.

DETAILED DESCRIPTION OF THE INVENTION

Certain aspects of the invention may be found in a method and system for a 60 GHz leaky wave high gain antenna. Exemplary aspects of the invention may comprise transmitting and/or receiving RF signals using one or more or more leaky wave antennas in a wireless device. The one or more leaky wave antennas may be integrated in metal traces on one or more of a chip, a package, and/or a printed circuit board. The metal traces may supply voltage signals to one or more circuits on the chip, package, and/or printed circuit board. The voltage signals may comprise DC bias voltages, and/or may comprise signals at a frequency that is lower than a resonant frequency of the leaky wave antennas. The leaky wave antennas may comprise microstrip lines where a cavity height of the leaky wave antennas is dependent on a spacing between the microstrip lines. The leaky wave antennas may comprise coplanar lines where a cavity height of the leaky wave antennas is dependent on a spacing between the coplanar lines. The RF signals may comprise 60 GHz signals. An angle of the transmitting and/or receiving of the wireless signals with a surface of the chip, package, and/or printed circuit board may be dynamically configured. The chip may be affixed to the package that is affixed to the printed circuit board. The leaky wave antennas may be configured by switches integrated in the chip, package, and/or printed circuit board.

Figure 1:
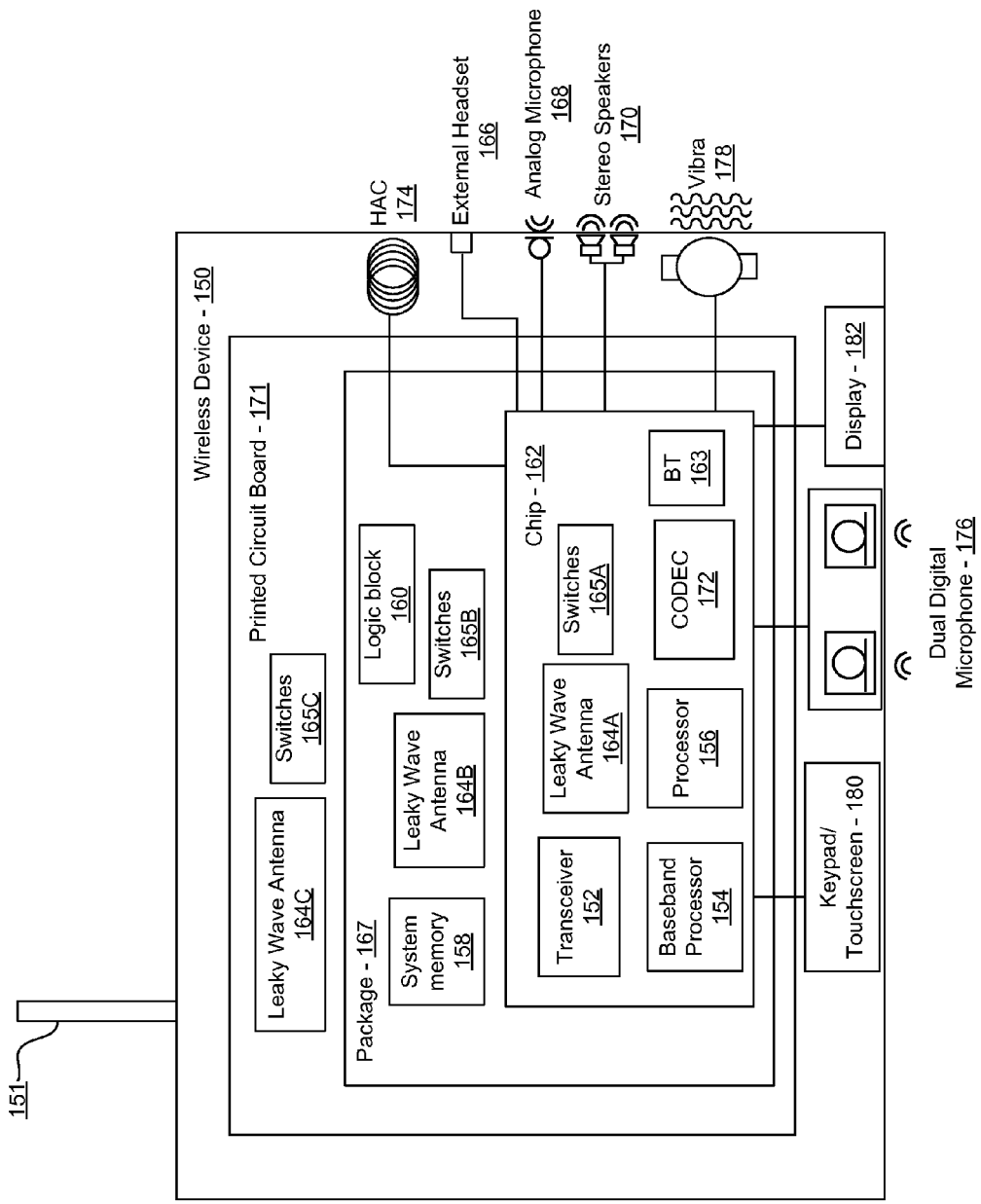
FIG. 1 is a block diagram of an exemplary wireless system with a 60 GHz leaky wave antenna, which may be utilized in accordance with an embodiment of the invention.

FIG. 1 is a block diagram of an exemplary wireless system with a 60 GHz leaky wave antenna, which may be utilized in accordance with an embodiment of the invention. Referring to FIG. 1, the wireless device 150 may comprise an antenna 151, a transceiver 152, a baseband processor 154, a processor 156, a system memory 158, a logic block 160, a chip 162, leaky wave antennas 164A, 164B, and 164C, switches 165A-165C, an external headset port 166, and a package 167. The wireless device 150 may also comprise an analog microphone 168, integrated hands-free (IHF) stereo speakers 170, a printed circuit board 171, a hearing aid compatible (HAC) coil 174, a dual digital microphone 176, a vibration transducer 178, a keypad and/or touchscreen 180, and a display 182.

The transceiver 152 may comprise suitable logic, circuitry, interface(s), and/or code that may be enabled to modulate and upconvert baseband signals to RF signals for transmission by one or more antennas, which may be represented generically by the antenna 151. The transceiver 152 may also be enabled to downconvert and demodulate received RF signals to baseband signals. The RF signals may be received by one or more antennas, which may be represented generically by the antenna 151, or the leaky wave antennas 164A and 164B. Different wireless systems may use different antennas for transmission and reception. The transceiver 152 may be enabled to execute other functions, for example, filtering the baseband and/or RF signals, and/or amplifying the baseband and/or RF signals. Although a single transceiver 152 is shown, the invention is not so limited. Accordingly, the transceiver 152 may be implemented as a separate transmitter and a separate receiver. In addition, there may be a plurality of transceivers, transmitters and/or receivers. In this regard, the plurality of transceivers, transmitters and/or receivers may enable the wireless device 150 to handle a plurality of wireless protocols and/or standards including cellular, WLAN and PAN. Wireless technologies handled by the wireless device 150 may comprise GSM, CDMA, CDMA2000, WCDMA, GMS, GPRS, EDGE, WIMAX, WLAN, 3GPP, UMTS, BLUETOOTH, and ZigBee, for example.

The baseband processor 154 may comprise suitable logic, circuitry, interface(s), and/or code that may be enabled to process baseband signals for transmission via the transceiver 152 and/or the baseband signals received from the transceiver 152. The processor 156 may be any suitable processor or controller such as a CPU, DSP, ARM, or any type of integrated circuit processor. The processor 156 may comprise suitable logic, circuitry, and/or code that may be enabled to control the operations of the transceiver 152 and/or the baseband processor 154. For example, the processor 156 may be utilized to update and/or modify programmable parameters and/or values in a plurality of components, devices, and/or processing elements in the transceiver 152 and/or the baseband processor 154. At least a portion of the programmable parameters may be stored in the system memory 158.

Control and/or data information, which may comprise the programmable parameters, may be transferred from other portions of the wireless device 150, not shown in FIG. 1, to the processor 156. Similarly, the processor 156 may be enabled to transfer control and/or data information, which may include the programmable parameters, to other portions of the wireless device 150, not shown in FIG. 1, which may be part of the wireless device 150.

The processor 156 may utilize the received control and/or data information, which may comprise the programmable parameters, to determine an operating mode of the transceiver 152. For example, the processor 156 may be utilized to select a specific frequency for a local oscillator, a specific gain for a variable gain amplifier, configure the local oscillator and/or configure the variable gain amplifier for operation in accordance with various embodiments of the invention. Moreover, the specific frequency selected and/or parameters needed to calculate the specific frequency, and/or the specific gain value and/or the parameters, which may be utilized to calculate the specific gain, may be stored in the system memory 158 via the processor 156, for example. The information stored in system memory 158 may be transferred to the transceiver 152 from the system memory 158 via the processor 156.

The system memory 158 may comprise suitable logic, circuitry, interface(s), and/or code that may be enabled to store a plurality of control and/or data information, including parameters needed to calculate frequencies and/or gain, and/or the frequency value and/or gain value. The system memory 158 may store at least a portion of the programmable parameters that may be manipulated by the processor 156.

The logic block 160 may comprise suitable logic, circuitry, interface(s), and/or code that may enable controlling of various functionalities of the wireless device 150. For example, the logic block 160 may comprise one or more state machines that may generate signals to control the transceiver 152 and/or the baseband processor 154. The logic block 160 may also comprise registers that may hold data for controlling, for example, the transceiver 152 and/or the baseband processor 154. The logic block 160 may also generate and/or store status information that may be read by, for example, the processor 156. Amplifier gains and/or filtering characteristics, for example, may be controlled by the logic block 160.

The BT radio/processor 163 may comprise suitable circuitry, logic, interface(s), and/or code that may enable transmission and reception of Bluetooth signals. The BT radio/processor 163 may enable processing and/or handling of BT baseband signals. In this regard, the BT radio/processor 163 may process or handle BT signals received and/or BT signals transmitted via a wireless communication medium. The BT radio/processor 163 may also provide control and/or feedback information to/from the baseband processor 154 and/or the processor 156, based on information from the processed BT signals. The BT radio/processor 163 may communicate information and/or data from the processed BT signals to the processor 156 and/or to the system memory 158. Moreover, the BT radio/processor 163 may receive information from the processor 156 and/or the system memory 158, which may be processed and transmitted via the wireless communication medium a Bluetooth headset, for example The CODEC 172 may comprise suitable circuitry, logic, interface(s), and/or code that may process audio signals received from and/or communicated to input/output devices. The input devices may be within or communicatively coupled to the wireless device 150, and may comprise the analog microphone 168, the stereo speakers 170, the hearing aid compatible (HAC) coil 174, the dual digital microphone 176, and the vibration transducer 178, for example. The CODEC 172 may be operable to up-convert and/or down-convert signal frequencies to desired frequencies for processing and/or transmission via an output device. The CODEC 172 may enable utilizing a plurality of digital audio inputs, such as 16 or 18-bit inputs, for example. The CODEC 172 may also enable utilizing a plurality of data sampling rate inputs. For example, the CODEC 172 may accept digital audio signals at sampling rates such as 8 kHz, 11.025 kHz, 12 kHz, 16 kHz, 22.05 kHz, 24 kHz, 32 kHz, 44.1 kHz, and/or 48 kHz. The CODEC 172 may also support mixing of a plurality of audio sources. For example, the CODEC 172 may support audio sources such as general audio, polyphonic ringer, $I^2S$ FM audio, vibration driving signals, and voice. In this regard, the general audio and polyphonic ringer sources may support the plurality of sampling rates that the audio CODEC 172 is enabled to accept, while the voice source may support a portion of the plurality of sampling rates, such as 8 kHz and 16 kHz, for example.

The chip 162 may comprise an integrated circuit with multiple functional blocks integrated within, such as the transceiver 152, the processor 156, the baseband processor 154, the BT radio/processor 163, the CODEC 172, and the leaky wave antenna 164A. The number of functional blocks integrated in the chip 162 is not limited to the number shown in FIG. 1. Accordingly, any number of blocks may be integrated on the chip 162 depending on chip space and wireless device 150 requirements, for example.

The leaky wave antennas 164A, 164B, and 164C may comprise a resonant cavity with a highly reflective surface and a lower reflectivity surface, and may be integrated in and/or on the chip 162, the package 167, and/or the printed circuit board 171. The lower reflectivity surface may allow the resonant mode to "leak" out of the cavity. The lower reflectivity surface of the leaky wave antennas 164A, 164B, and 164C may be configured with slots in a metal surface, or a pattern of metal patches, as described further in FIGS. 2 and 3. The physical dimensions of the leaky wave antennas 164A, 164B, and 164C may be configured to optimize bandwidth of transmission and/or the beam pattern radiated. In another embodiment of the invention, the leaky wave antenna 164B may be integrated in and/or on the package 167, and the leaky wave antenna 164C may be integrated in and/or on the printed circuit board 171 to which the chip 162 may be affixed. In this manner, the dimensions of the leaky wave antennas 164B and 164C may not be limited by the size of the chip 162.

In an exemplary embodiment of the invention, the leaky wave antennas 164A, 164B, and/or 164C may comprise a plurality of leaky wave antennas integrated in and/or on the chip 162, the package 167, and/or the printed circuit board 171, and may be integrated into various conductive lines in and/or on the chip 162, the package 167, and/or the printed circuit board 171. The conductive lines may comprise bias voltage lines, digital signal lines, and/or joint test action group (JTAG) lines, for example. The leaky wave antennas 164A, 164B, and/or 164C may be operable to transmit and/or receive wireless signals at or near 60 GHz, for example, due to the cavity length of the devices being on the order of millimeters.

Figure 3:
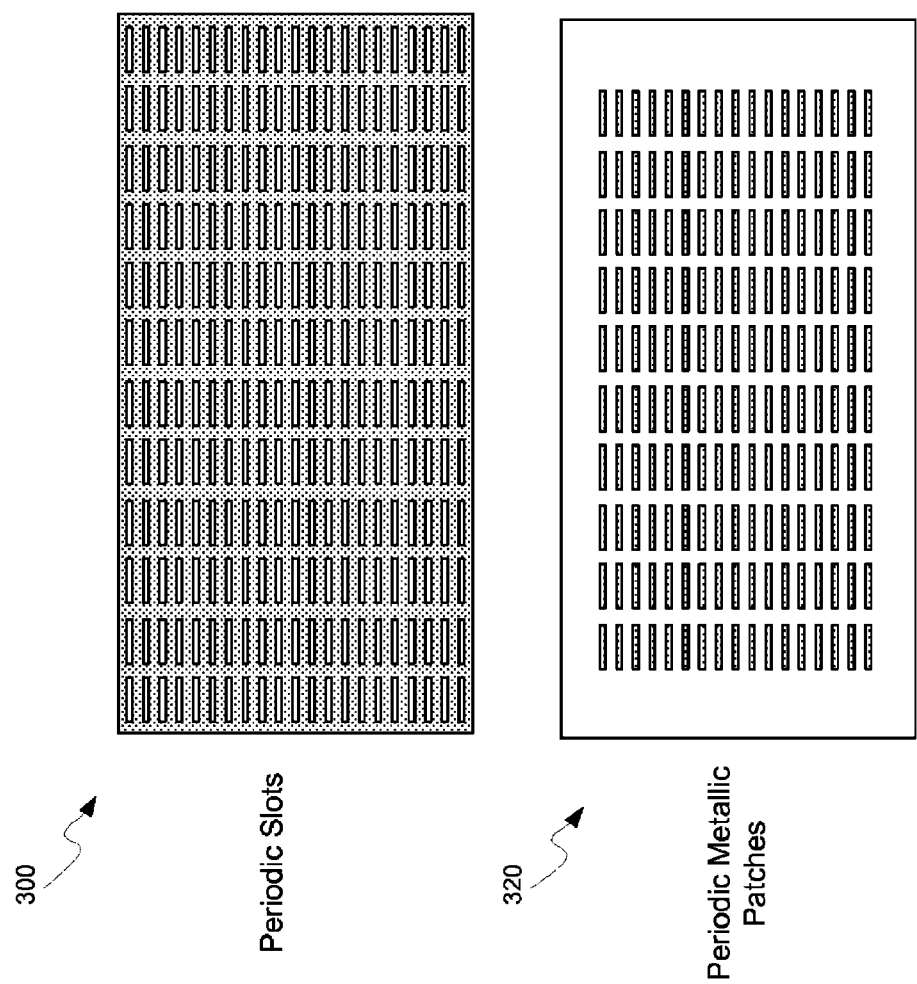
FIG. 3 is a block diagram illustrating a plan view of exemplary partially reflective surfaces, in accordance with an embodiment of the invention.

The switches 165A-165C may comprise switches such as CMOS or MEMS switches that may be operable to switch elements in and/or out of the leaky wave antennas 164A-164C, such as the patches and slots described in FIG. 3.

The external headset port 166 may comprise a physical connection for an external headset to be communicatively coupled to the wireless device 150. The analog microphone 168 may comprise suitable circuitry, logic, interface(s), and/or code that may detect sound waves and convert them to electrical signals via a piezoelectric effect, for example. The electrical signals generated by the analog microphone 168 may comprise analog signals that may require analog to digital conversion before processing.

The package 167 may comprise a ceramic package, a printed circuit board, or other support structure for the chip 162 and other components of the wireless device 150. In this regard, the chip 162 may be bonded to the package 167. The package 167 may comprise insulating and conductive material, for example, and may provide isolation between electrical components mounted on the package 167.

The stereo speakers 170 may comprise a pair of speakers that may be operable to generate audio signals from electrical signals received from the CODEC 172. The HAC coil 174 may comprise suitable circuitry, logic, and/or code that may enable communication between the wireless device 150 and a T-coil in a hearing aid, for example. In this manner, electrical audio signals may be communicated to a user that utilizes a hearing aid, without the need for generating sound signals via a speaker, such as the stereo speakers 170, and converting the generated sound signals back to electrical signals in a hearing aid, and subsequently back into amplified sound signals in the user's ear, for example.

The dual digital microphone 176 may comprise suitable circuitry, logic, interface(s), and/or code that may be operable to detect sound waves and convert them to electrical signals. The electrical signals generated by the dual digital microphone 176 may comprise digital signals, and thus may not require analog to digital conversion prior to digital processing in the CODEC 172. The dual digital microphone 176 may enable beamforming capabilities, for example.

The vibration transducer 178 may comprise suitable circuitry, logic, interface(s), and/or code that may enable notification of an incoming call, alerts and/or message to the wireless device 150 without the use of sound. The vibration transducer may generate vibrations that may be in synch with, for example, audio signals such as speech or music.

In operation, control and/or data information, which may comprise the programmable parameters, may be transferred from other portions of the wireless device 150, not shown in FIG. 1, to the processor 156. Similarly, the processor 156 may be enabled to transfer control and/or data information, which may include the programmable parameters, to other portions of the wireless device 150, not shown in FIG. 1, which may be part of the wireless device 150.

The processor 156 may utilize the received control and/or data information, which may comprise the programmable parameters, to determine an operating mode of the transceiver 152. For example, the processor 156 may be utilized to select a specific frequency for a local oscillator, a specific gain for a variable gain amplifier, configure the local oscillator and/or configure the variable gain amplifier for operation in accordance with various embodiments of the invention. Moreover, the specific frequency selected and/or parameters needed to calculate the specific frequency, and/or the specific gain value and/or the parameters, which may be utilized to calculate the specific gain, may be stored in the system memory 158 via the processor 156, for example. The information stored in system memory 158 may be transferred to the transceiver 152 from the system memory 158 via the processor 156.

The CODEC 172 in the wireless device 150 may communicate with the processor 156 in order to transfer audio data and control signals. Control registers for the CODEC 172 may reside within the processor 156. The processor 156 may exchange audio signals and control information via the system memory 158. The CODEC 172 may up-convert and/or down-convert the frequencies of multiple audio sources for processing at a desired sampling rate.

The leaky wave antennas 164A, 164B, and/or 164C may be operable to transmit and/or receive wireless signals via conductive lines integrated in and/or on the chip 162, the package 167, and/or the printed circuit board 171. Resonant cavities may be configured in the conductive lines so that signals may be transmitted and/or received from any location on the chip 162, the package 167, and/or the printed circuit board 171 without requiring large areas needed for conventional antennas and associated circuitry.

In an exemplary embodiment of the invention, the resonant cavity frequency of the leaky wave antennas 164A-164C may be configured by tuning the cavity height using MEMS actuation. Accordingly, a bias voltage may be applied such that one or both of the reflective surfaces of the leaky wave antennas 164A-164C may be deflected by the applied potential. In this manner, the cavity height, and thus the resonant frequency of the cavity, may be configured. Similarly, the patterns of slots and/or patches in the partially reflected surface may be configured by the switches 165A-165C.

Figure 2:
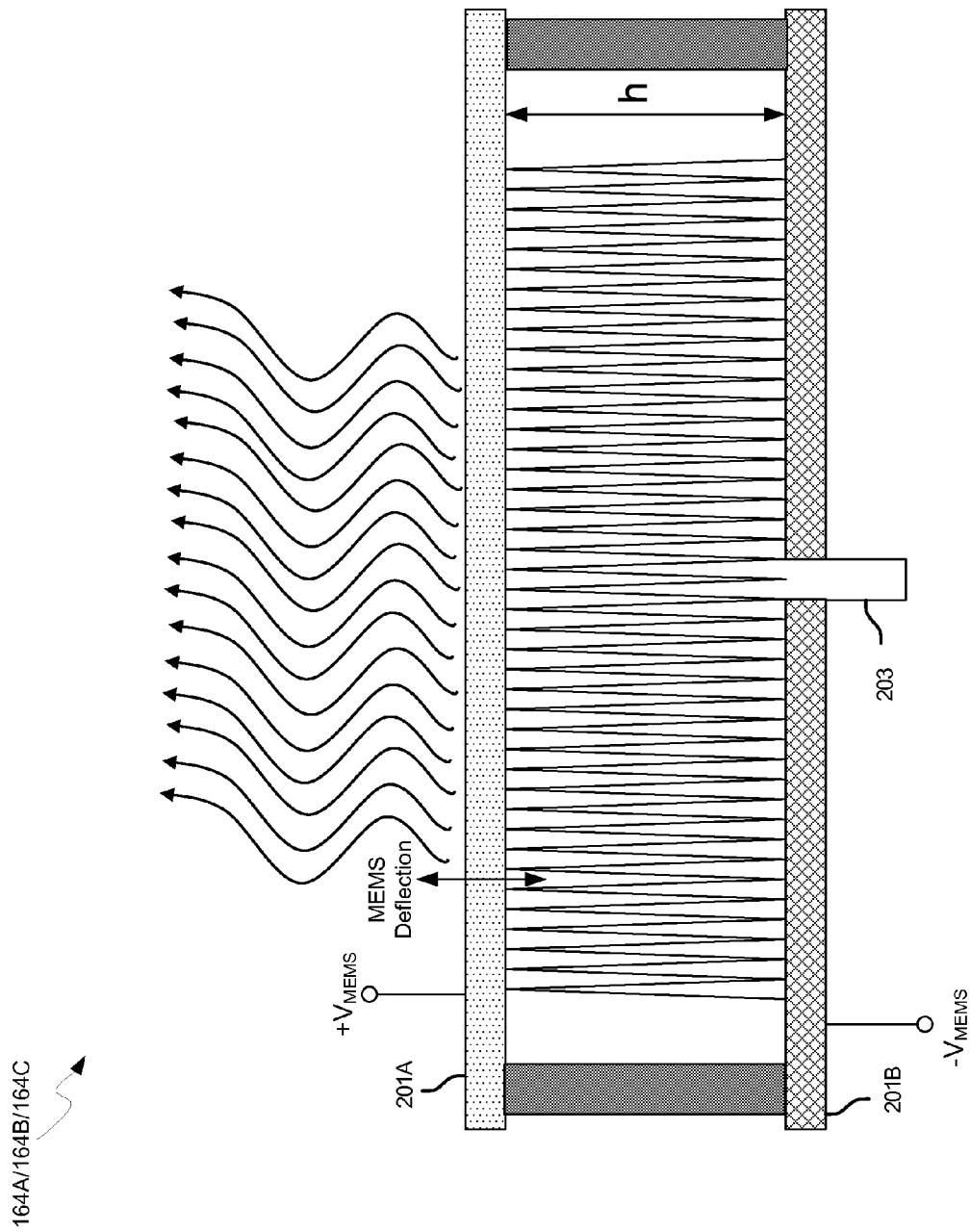
FIG. 2 is a block diagram illustrating an exemplary leaky wave antenna, in accordance with an embodiment of the invention.

FIG. 2 is a block diagram illustrating an exemplary leaky wave antenna, in accordance with an embodiment of the invention. Referring to FIG. 2, there is shown the leaky wave antennas 164A, 164B, and/or 164C comprising a partially reflective surface 201A, a reflective surface 201B, and a feed point 203. The space between the partially reflective surface 201A and the reflective surface 201B may be filled with dielectric material, for example, and the height, h, between the partially reflective surface 201A and the reflective surface 201B may be utilized to configure the frequency of transmission of the leaky wave antenna 164A, 164B, and/or 164C. There is also shown (micro-electromechanical systems) MEMS bias voltages, $+V_{MEMS}$ and $-V_{MEMS}$.

The feed point 203 may comprise an input terminal for applying an input voltage to the leaky wave antenna 164A, 164B, and/or 164C. The invention is not limited to a single feed point 203, as there may be any amount of feed points for different phases of signal or a plurality of signal sources, for example, to be applied to the leaky wave antenna 164A, 164B, and/or 164C.

In an embodiment of the invention, the height, h, may be one-half the wavelength of the desired transmitted mode from the leaky wave antenna 164A, 164B, and/or 164C. In this manner, the phase of an electromagnetic mode that traverses the cavity twice may be coherent with the input signal at the feed point 203, thereby configuring a resonant cavity known as a Fabry-Perot cavity. The magnitude of the resonant mode may decay exponentially in the lateral direction from the feed point 203, thereby reducing or eliminating the need for confinement structures to the sides of the leaky wave antenna 164A, 164B, and/or 164C. The input impedance of the leaky wave antenna 164A, 164B, and/or 164C may be configured by the vertical placement of the feed point 203, as described further in FIG. 6.

In operation, a signal to be transmitted via a power amplifier may be communicated to the feed point 203 of the leaky wave antennas 164A, 164B, and/or 164C with a frequency f. The cavity height, h, may be configured to correlate to one half the wavelength of a harmonic of the signal of frequency f. The signal may traverse the height of the cavity and may be reflected by the partially reflective surface 201A, and then traverse the height back to the reflective surface 201B. Since the wave will have traveled a distance corresponding to a full wavelength, constructive interference may result and a resonant mode may thereby be established.

Leaky wave antennas may enable the configuration of high gain antennas without the need for a large array of antennas which require a complex feed network and suffer from loss due to feed lines. The leaky wave antennas 164A, 164B, and/or 164C may be operable to transmit and/or receive wireless signals via conductive lines integrated in and/or on the chip 162, the package 167, and/or the printed circuit board 171. Resonant cavities may be configured in the conductive lines so that signals may be transmitted and/or received from any location on the chip 162, the package 167, and/or the printed circuit board 171 without requiring large areas needed for conventional antennas and associated circuitry.

In an exemplary embodiment of the invention, the resonant cavity frequency may be configured by tuning the cavity height, h, using MEMS actuation. Accordingly, a bias voltage may be applied at $+V_{MEMS}$ and $-V_{MEMS}$ such that one or both of the reflective surfaces 201A and 201B may be deflected by the applied potential. In this manner, the cavity height, h, and thus the resonant frequency of the cavity may be configured.

FIG. 3 is a block diagram illustrating a plan view of exemplary partially reflective surfaces, in accordance with an embodiment of the invention. Referring to FIG. 3, there is shown a partially reflective surface 300 comprising periodic slots in a metal surface, and a partially reflective surface 320 comprising periodic metal patches. The partially reflective surfaces 300/320 may comprise different embodiments of the partially reflective surface 201A described with respect to FIG. 2.

The spacing, dimensions, shape, and orientation of the slots and/or patches in the partially reflective surfaces 300/320 may be utilized to configure the bandwidth, and thus Q-factor, of the resonant cavity defined by the partially reflective surfaces 300/320 and a reflective surface, such as the reflective surface 201B, described with respect to FIG. 2. The partially reflective surfaces 300/320 may thus comprise frequency selective surfaces due to the narrow bandwidth of signals that may leak out of the structure as configured by the slots and/or patches.

The spacing between the patches and/or slots may be related to wavelength of the signal transmitted and/or received, which may be somewhat similar to beamforming with multiple antennas. The length of the slots and/or patches may be several times larger than the wavelength of the transmitted and/or received signal or less, for example, since the leakage from the slots and/or regions surround the patches may add up, similar to beamforming with multiple antennas.

In an embodiment of the invention, the slots/patches may be configured via CMOS and/or micro-electromechanical system (MEMS) switches, such as the switches 165A-165C described with respect to FIG. 1, to tune the Q of the resonant cavity. The slots and/or patches may be configured in metal traces on the chip 162, the package 167, and/or the printed circuit board 171 and may be shorted together or switched open utilizing the switches 165A-165C. In this manner, RF signals, such as 60 GHz signals, for example, may be transmitted from various locations without the need for additional circuitry and conventional antennas with their associated circuitry that require valuable chip, package, and/or printed circuit board space.

Figure 4:
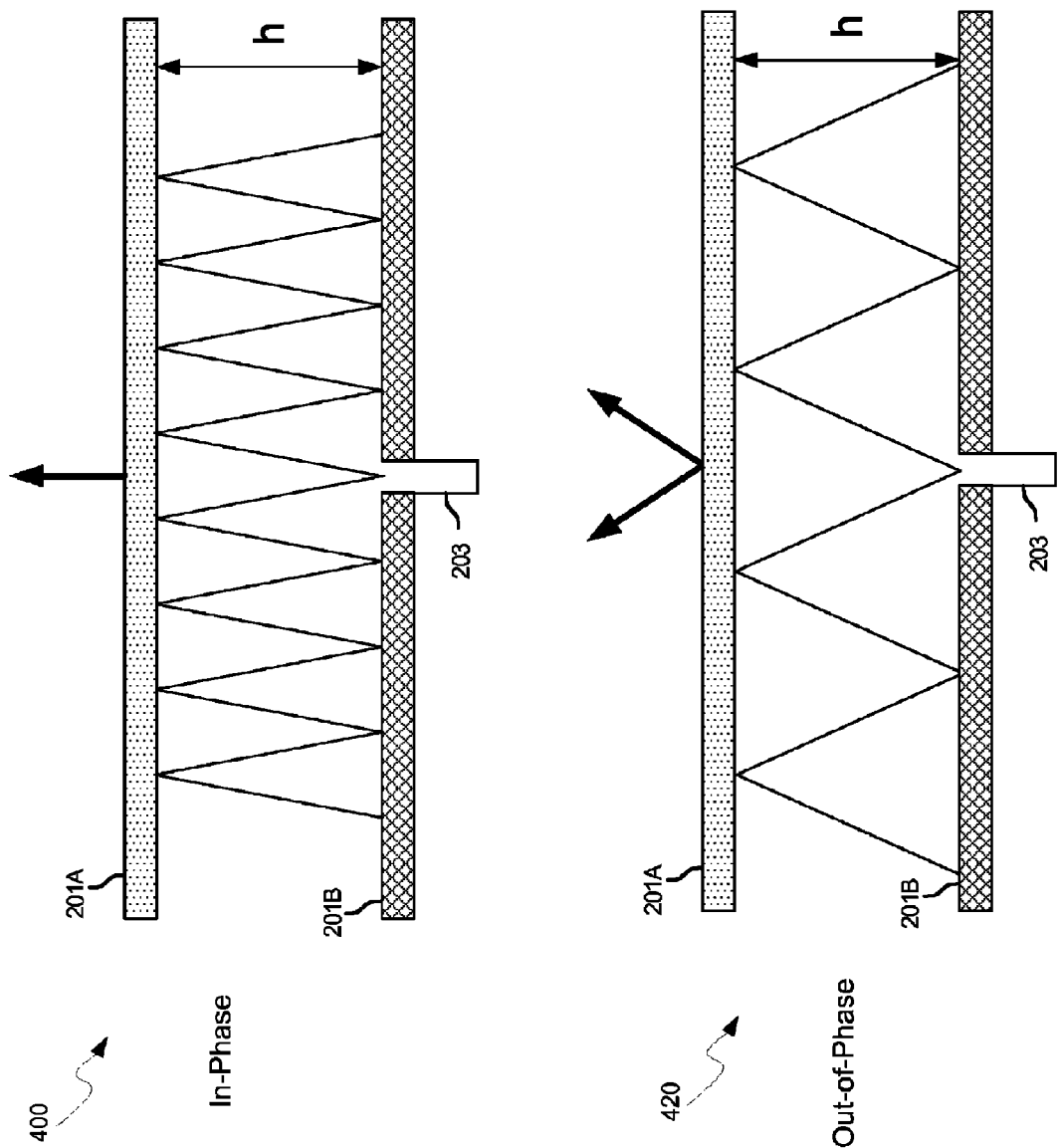
FIG. 4 is a block diagram illustrating an exemplary phase dependence of a leaky wave antenna, in accordance with an embodiment of the invention.

FIG. 4 is a block diagram illustrating an exemplary phase dependence of a leaky wave antenna, in accordance with an embodiment of the invention. Referring to FIG. 4, there is shown a leaky wave antenna comprising the partially reflective surface 201A, the reflective surface 201B, and the feed point 203. In-phase condition 400 illustrates the relative beam shape transmitted by the leaky wave antenna 164A, 164B, and/or 164C when the frequency of the signal communicated to the feed point 203 matches that of the resonant cavity as defined by the cavity height, h, and the dielectric constant of the material between the reflective surfaces.

Similarly, out-of-phase condition 420 illustrates the relative beam shape transmitted by the leaky wave antenna 164A, 164B, and/or 164C when the frequency of the signal communicated to the feed point 203 does not match that of the resonant cavity. The resulting beam shape may be conical, as opposed to a single main vertical node. These are illustrated further with respect to FIG. 5. The leaky wave antennas 164A, 164B, and/or 164C may be integrated in the chip 162, the package 167, and/or the printed circuit board 171, thereby providing a plurality of transmission and reception sites across the chip 162, the package 167, and/or the printed circuit board 171 as well as providing the other purposes of the traces, such as supplying bias voltages, digital signals, and/or JTAG signals, for example.

By configuring the leaky wave antennas for in-phase and out-of-phase conditions, signals may be directed out of the chip 162 in desired directions. In an exemplary embodiment of the invention, the angle at which signals may be transmitted by a leaky wave antenna may be dynamically controlled so that signal may be directed to desired receiving leaky wave antennas. In another embodiment of the invention, the leaky wave antennas 164A, 164B, and/or 164C may be operable to receive RF signals, such as 60 GHz signals, for example. The direction in which the signals are received may be configured by the in-phase and out-of-phase conditions.

Figure 5:
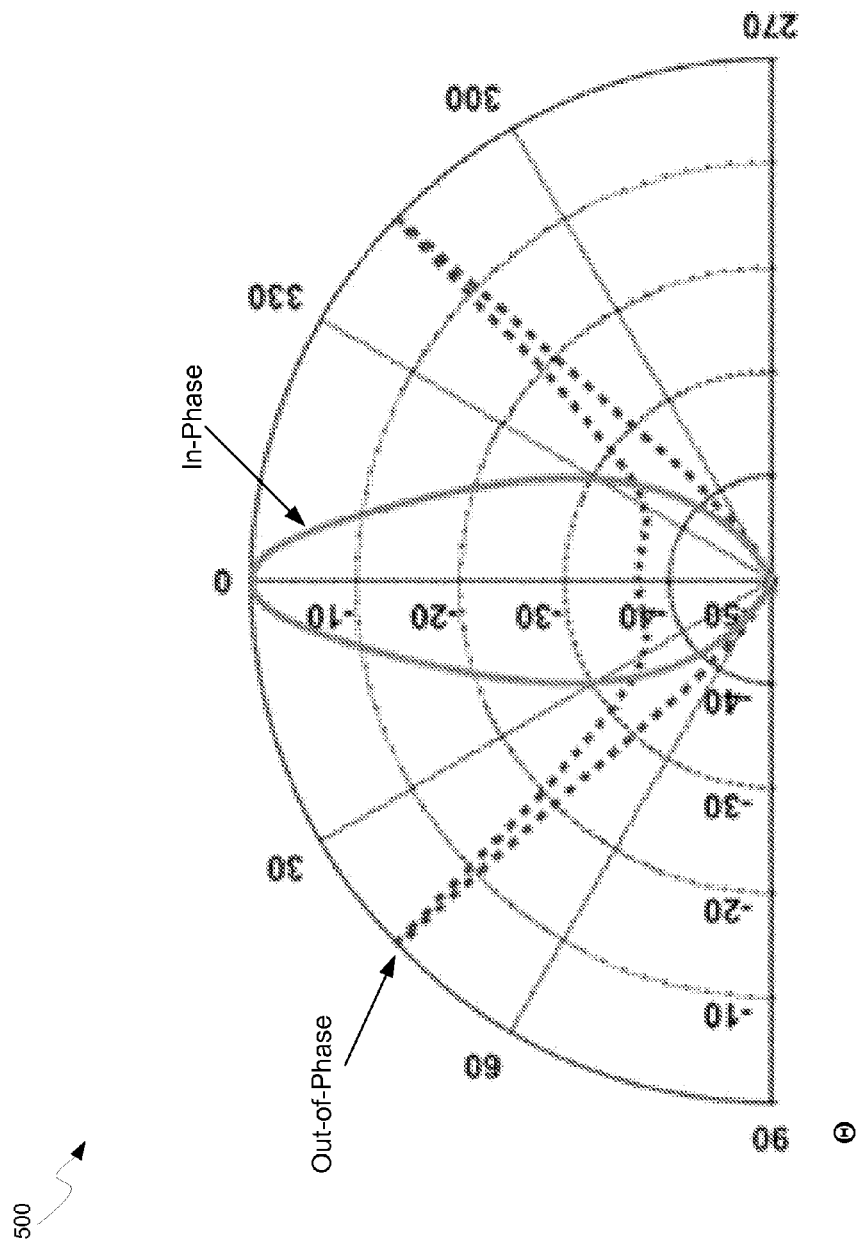
FIG. 5 is a block diagram illustrating exemplary in-phase and out-of-phase beam shapes for a leaky wave antenna, in accordance with an embodiment of the invention.

FIG. 5 is a block diagram illustrating exemplary in-phase and out-of-phase beam shapes for a leaky wave antenna, in accordance with an embodiment of the invention. Referring to FIG. 5, there is shown a plot 500 of transmitted signal beam shape versus angle, Θ, for the in-phase and out-of-phase conditions for a leaky wave antenna.

The In-phase curve in the plot 500 may correlate to the case where the frequency of the signal communicated to a leaky wave antenna matches the resonant frequency of the cavity. In this manner, a single vertical main node may result. In instances where the frequency of the signal at the feed point is not at the resonant frequency, a double, or conical-shaped node may be generated as shown by the Out-of-phase curve in the plot 500. By configuring the leaky wave antennas for in-phase and out-of-phase conditions, signals may be directed out of the chip 162, the package 167, and/or the printed circuit board 171 in desired directions.

In another embodiment of the invention, the leaky wave antennas 164A, 164B, and/or 164C may be operable to receive wireless signals, and may be configured to receive from a desired direction via the in-phase and out-of-phase configurations.

Figure 6:
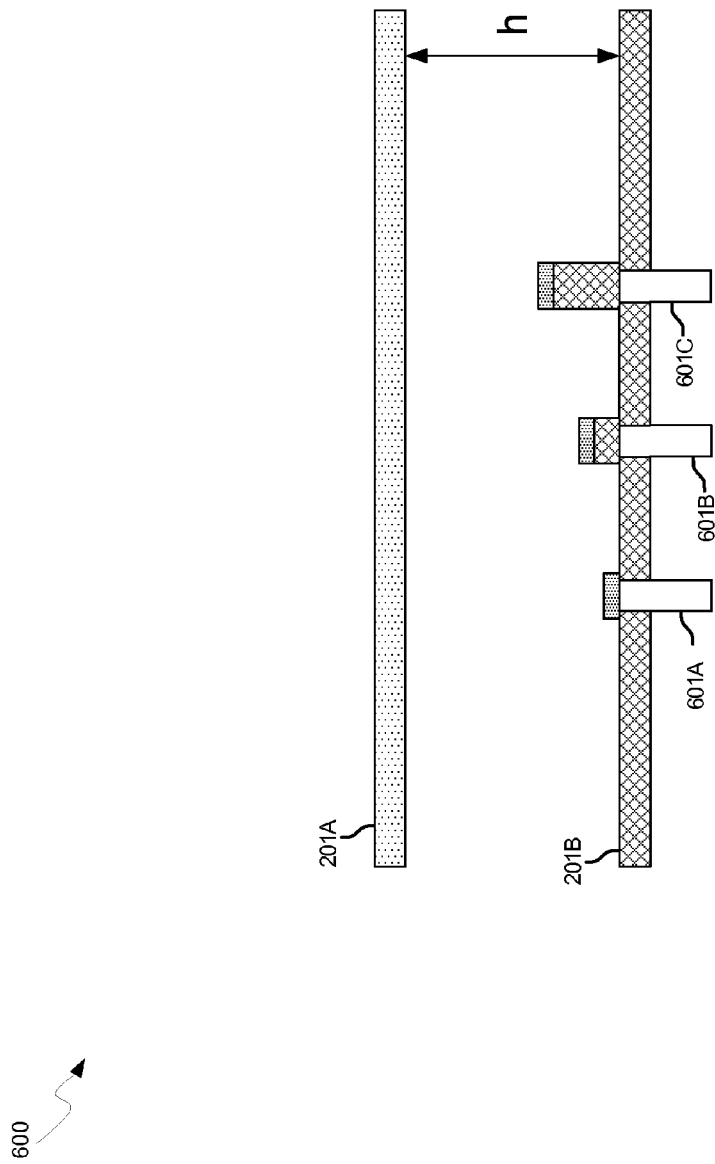
FIG. 6 is a block diagram illustrating a leaky wave antenna with variable input impedance feed points, in accordance with an embodiment of the invention.

FIG. 6 is a block diagram illustrating a leaky wave antenna with variable input impedance feed points, in accordance with an embodiment of the invention. Referring to FIG. 6, there is shown a leaky wave antenna 600 comprising the partially reflective surface 201A and the reflective surface 201B. There is also shown feed points 601A-601C. The feed points 601A-601C may be located at different positions along the height, h, of the cavity thereby configuring different impedance points for the leaky wave antenna.

In this manner, a leaky wave antenna may be utilized to couple to a plurality of power amplifiers, low-noise amplifiers, and/or other circuitry with varying output or input impedances. Similarly, by integrating leaky wave antennas in conductive traces in the chip 162, the package 167, and/or the printed circuit board 171, the impedance of the leaky wave antenna may be matched to the power amplifier or low-noise amplifier without impedance variations that may result with conventional antennas and their distance to associated driver electronics.

Figure 7:
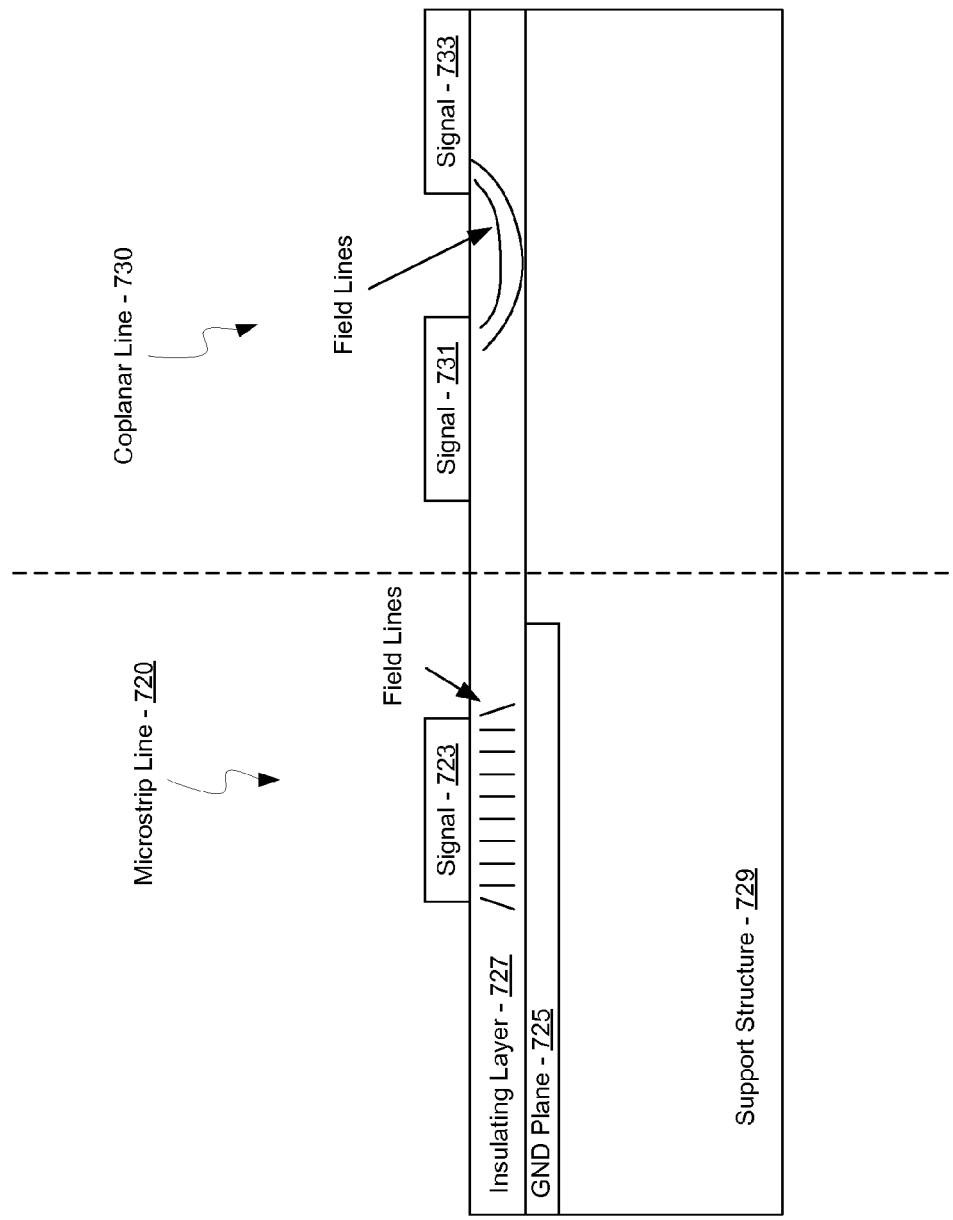
FIG. 7 is a block diagram illustrating a cross-sectional view of coplanar and microstrip lines, in accordance with an embodiment of the invention.

FIG. 7 is a block diagram illustrating a cross-sectional view of coplanar and microstrip lines, in accordance with an embodiment of the invention. Referring to FIG. 7, there is shown a microstrip line 720 and a coplanar line 730. The microstrip line 720 may comprise signal conductive lines 723, a ground plane 725, an insulating layer 727 and a substrate 729. The coplanar line 730 may comprise signal conductive lines 731 and 733, the insulating layer 727, and the support structure 729.

The signal conductive lines 723, 731, and 733 may comprise metal traces deposited in and/or on the insulating layer 727. In another embodiment of the invention, the signal conductive lines 723, 731, and 733 may comprise poly-silicon or other conductive material. The separation and the voltage potential between the signal conductive line 723 and the ground plane 725 may determine the electric field generated therein. In addition, the dielectric constant of the insulating layer 727 may also determine the electric field between the signal conductive line 723 and the ground plane 725.

The insulating layer 727 may comprise $SiO_2$ or other insulating material that may provide a high resistance layer between the signal conductive line 723 and the ground plane 725. In addition, the electric field between the signal conductive line 723 and the ground plane 725 is dependent on the dielectric constant of the insulating layer 727.

The coplanar line 730 may comprise the signal conductive lines 731 and 733 and the insulating layer 727. The thickness and the dielectric constant of the insulating layer 727 may determine the electric field strength generated by the applied signal. The resonant cavity thickness of a leaky wave antenna may be dependent on the spacing between the signal conductive line 723 and the ground plane 725, or the signal conductive lines 731 and 733.

The support structure 729 may comprise the chip 162, the package 167, and/or the printed circuit board 171, that may provide mechanical support for the microstrip line 720, the coplanar line 730, and other devices that may be integrated within. In another embodiment of the invention, the support structure 729 may comprise Si, GaAs, sapphire, InP, GaO, ZnO, CdTe, CdZnTe, ceramics, polytetrafluoroethylene, and/or $Al_2O_3$, for example, or any other substrate material that may be suitable for integrating microstrip structures.

In operation, a bias and/or a signal voltage may be applied across the signal conductive line 723 and the ground plane 725, and/or the signal conductive lines 731 and 733. The thickness of a leaky wave antenna resonant cavity may be dependent on the distance between the conductive lines in the microstrip line 720 and/or the coplanar transmission line 730.

In addition to DC bias, ground, and/or digital signals communicated electrically by the microstrip line 720 and/or the coplanar line 730, a high frequency signal to be transmitted or received, such as a 60 GHz RF signal, may be communicated to or from the signal conductive lines 723, 731, and 733, and the ground plane 725. The signal to be communicated electrically may be at a frequency that is lower than the resonant frequency of the cavity formed in the microstrip line 720 and/or the coplanar line 730. In this manner, the conductive lines on the chip 162, the package 167, and/or the printed circuit board 171 may transmit and/or receive 60 GHz signals as well as supply DC bias, JTAG signals, and/or communicate lower frequency digital signals, for example.

Figure 8:
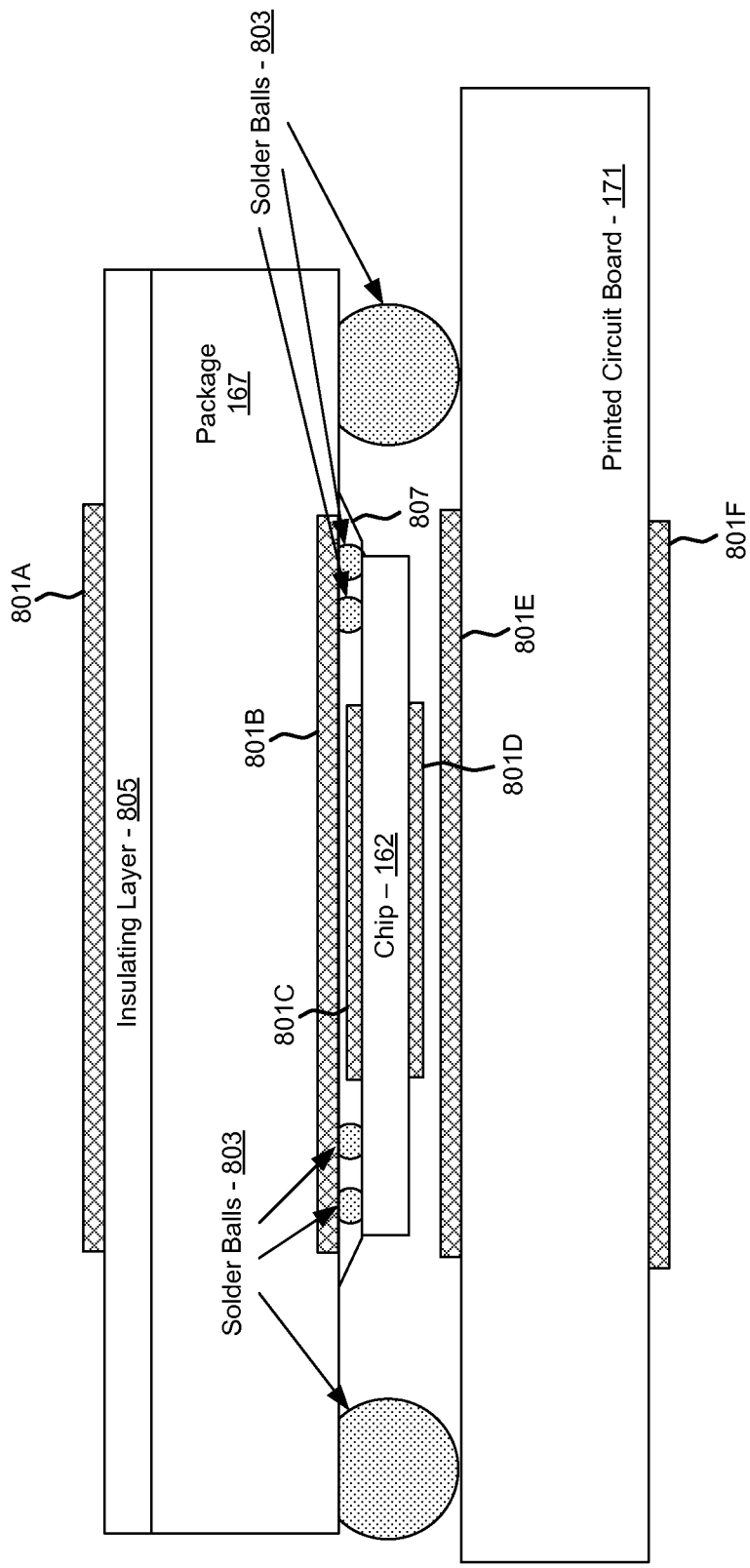
FIG. 8 is a diagram illustrating a cross-sectional view of a chip, package, and printed circuit board with integrated leaky wave antennas, in accordance with an embodiment of the invention.

FIG. 8 is a diagram illustrating a cross-sectional view of a chip, package, and printed circuit board with integrated leaky wave antennas, in accordance with an embodiment of the invention. Referring to FIG. 8, there is shown the chip 162, the package 167, and/or the printed circuit board 171, metal layers 801A-801F, solder balls 803, an insulating layer 805, and thermal epoxy 807. The chip 162, the package 167, and/or the printed circuit board 171 may be as described previously.

The chip 162, or integrated circuit, may comprise one or more components and/or systems within the wireless system 150. The chip 162 may be bump-bonded or flip-chip bonded to the package 167 utilizing the solder balls 803. In this manner, wire bonds connecting the chip 162 to the package 167 may be eliminated, thereby reducing and/or eliminating uncontrollable stray inductances due to wire bonds, for example. In addition, the thermal conductance out of the chip 162 may be greatly improved utilizing the solder balls 803 and the thermal epoxy 807. The thermal epoxy 807 may be electrically insulating but thermally conductive to allow for thermal energy to be conducted out of the chip 162 to the much larger thermal mass of the package 167.

The metal layers 801A-801F may comprise deposited metal layers utilized to delineate waveguides and/or other traces on the chip 162, the package 167, and/or the printed circuit board 171. The metal layers 801A-801F may be utilized to communicate signals between blocks of the chip 162, the package 167, and/or the printed circuit board 171. In an embodiment of the invention, the spacing between pairs of metal layers, for example 801A and 801B, 801C and 801D, and 801E and 801F, may define a resonant cavity of a leaky wave antenna. In this regard, a partially reflective surface, as shown in FIGS. 2 and 3, for example, may enable the resonant electromagnetic mode in the cavity to leak out from that surface. In this manner, leaky wave antennas may be operable to communicate wireless signals to and/or from the chip 162, the package 167, and/or the printed circuit board 171.

The metal layers 801A-801F may comprise a coplanar and/or a microstrip structure as described with respect to FIG. 7. The insulating layer 805 may comprise a layer of resistive material that may provide electrical isolation between the metal layers 801A and other layers and/or devices in the package 163.

The number of metal layers are not limited to the number of metal layers 801A-801F shown in FIG. 8. Accordingly, there may be any number of layers embedded within and/or on the chip 162, the package 167, and the printed circuit board 171, depending on the number of traces, waveguides and other devices fabricated within and/or on the chip 162, the package 167, and/or the printed circuit board 171.

The solder balls 803 may comprise spherical balls of metal to provide electrical, thermal and physical contact between the chip 162, the package 167, and/or the printed circuit board 171. In making the contact with the solder balls 803, the chip 162 and/or the package 167 may be pressed with enough force to squash the metal spheres somewhat, and may be performed at an elevated temperature to provide suitable electrical resistance and physical bond strength. The thermal epoxy 807 may fill the volume between the solder balls 803 and may provide a high thermal conductance path for heat transfer out of the chip 162.

In operation, the chip 162 may comprise an RF front end, such as the RF transceiver 152, described with respect to FIG. 1, and may be utilized to transmit and/or receive RF signals, at 60 GHz, for example. The chip 162 may be electrically coupled to the package 167. In instances where high frequency signals, 60 GHz or greater, for example, may be communicated between blocks or sections in the chip 162, the package 167, and/or the printed circuit board 171, leaky wave antennas may be utilized. Accordingly, the leaky wave antennas comprising the metal layers 801A-801F integrated on or within the chip 162, the package 167, and/or the printed circuit board 171 may be enabled to communicate signals between blocks or sections within the chip 162, the package 167, and/or the printed circuit board 171.

Heat from the chip 162 may be conducted to the package 167 via the thermal epoxy 807 and the solder balls 803. In an embodiment of the invention, the metal layers 801A-801F may also be operable to provide bias voltages, signal voltages, digital controls signals, and/or lower frequency control signals, for example, communicated within and between the chip 162, the package 167, and/or the printed circuit board 171. The low frequency control signals may comprise 3-wire signal signals comprising clock and data streams, for example.

The leaky wave antennas comprising the metal layers 801A-801F may be configured by adjusting the spacing between the pairs of metal layers comprising a resonant cavity, and may be configurable via MEMS actuation, as described with respect to FIG. 2. Accordingly, the cavity height of a leaky wave antenna may be defined by a MEMS switch such that applying a bias may increase or decrease the spacing, thereby configuring the resonant frequency of the leaky wave antenna. In addition, the slots and/or patches in the metal layer comprising a partially reflective surface for the leaky wave antenna, may be configured via switches, which may alter the Q-factor of the cavity. In this manner, the communication parameters of leaky wave antennas integrated into the chip 162, the package 167, and/or the printed circuit board 171 may be configured for a plurality of applications.

By integrating leaky wave antennas in the chip 162, the package 167, and/or the printed circuit board 171, stray impedances may be greatly reduced compared to wirebonded connections to devices on printed circuit boards as in conventional systems, particularly for higher frequencies, such as 60 GHz. In this manner, volume requirements may be reduced and performance may be improved due to lower losses and accurate control of impedances via switches in the chip 162 or on the package 167, for example.

Figure 9:
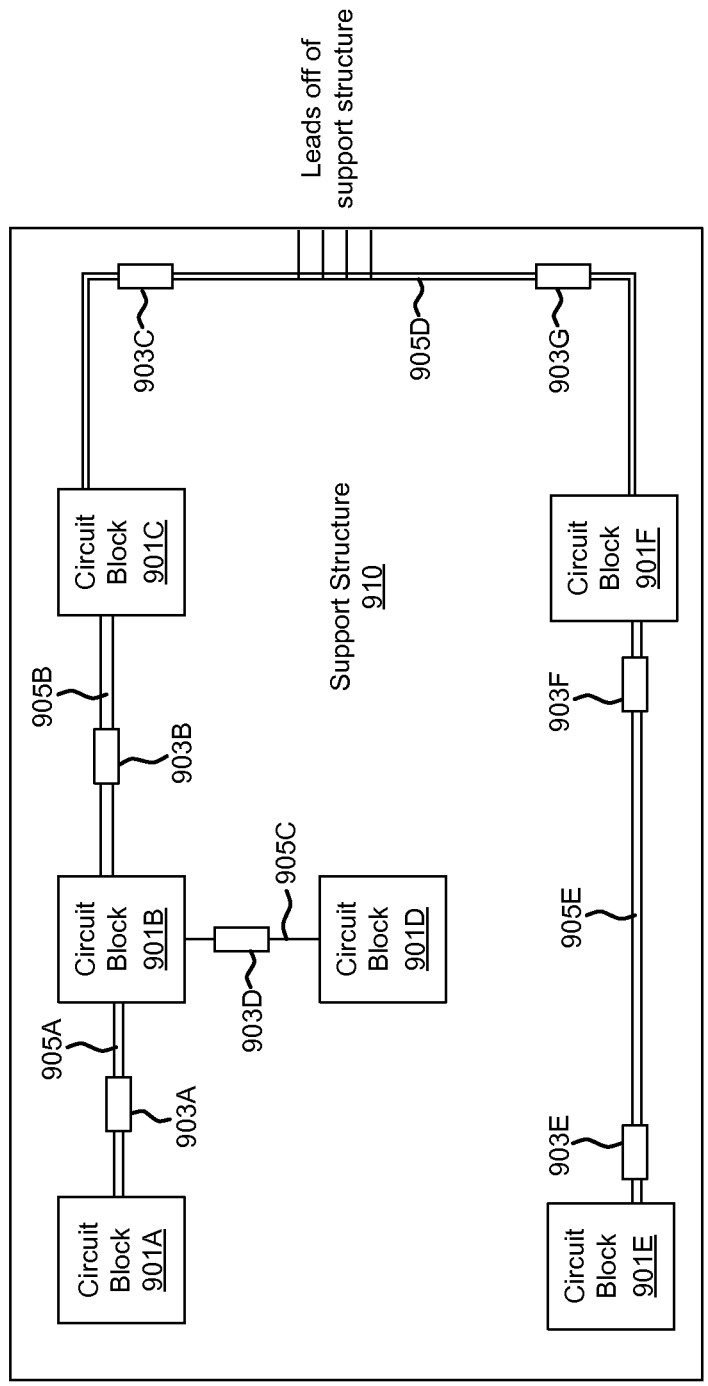
FIG. 9 is a block diagram illustrating a plan view of a chip, package, and/or printed circuit board with integrated leaky wave antennas, in accordance with an embodiment of the invention.

FIG. 9 is a block diagram illustrating a plan view of a chip, package, and/or printed circuit board with integrated leaky wave antennas, in accordance with an embodiment of the invention. Referring to FIG. 9, there is shown circuit blocks 901A-901F, leaky wave antennas 903A-903G, metal traces 905A-905E, and support structure 910. The support structure may comprise the chip 162, the package 167, and/or the printed circuit board 171.

The circuit blocks 901A-901F may comprise various sections of circuitry on the chip 162, the package 167, and/or the printed circuit board 171. The circuit blocks 901A-901F may be coupled via the metal traces 905A-905E. The metal traces 905A-905E may comprise a plurality of metal traces on the chip 162, the package 167, and/or the printed circuit board 171 for supplying bias voltages, ground, or low frequency signals, for example.

The leaky wave antennas 903A-903G may be substantially similar to the leaky wave antennas 164A-164C described with respect to FIG. 1, and may be integrated in the metal traces 905A-905E by configuring resonant cavities in desired sections of the metal traces 905A-905E. The leaky wave antennas 903A-903G may be operable to transmit and/or receive signals communicated between the chip 162, the package 167, and/or the printed circuit board 171. In addition the leaky wave antennas 903A-903G may be operable to communicate with other wireless devices external to the wireless device 150.

In operation, the circuit blocks 901A-901F may generate high frequency signals, 60 GHz for example, to be transmitted wirelessly. The metal traces 905A-905E may communicate the signals for transmission while also supplying bias voltages, ground, and/or low frequency signals between the circuit blocks 901A-901F. The high frequency signals may be configured at a frequency that corresponds to the resonant frequency of one or more of the leaky wave antennas 903A-903G. In this manner, the metal traces 905A-905E may transmit high frequency signals via the integrated leaky wave antennas 903A-903G without the need for additional dedicated antennas, thereby reducing space requirements on the chip 162, the package 167, and/or the printed circuit board 171.

The leaky wave antennas 903A-903G may be operable to communicate signals within and/or between the chip 162, the package 167, and/or the printed circuit board 171, or to and/or from devices external to the wireless device 150. The configurable beam pattern, as described with respect to FIGS. 4 and 5, may enable changing the communication path from the leaky wave antennas 903A-903G.

The leaky wave antennas 903A-903G may also be operable to receive wireless signals to then be communicated to the circuit blocks 901A-901F. In this manner, the leaky wave antenna closest to the target circuit block may be enabled to receive the desired signal, thereby limiting the length of signal lines needed to communicate high frequency signals to appropriate processing circuitry.

Figure 10:
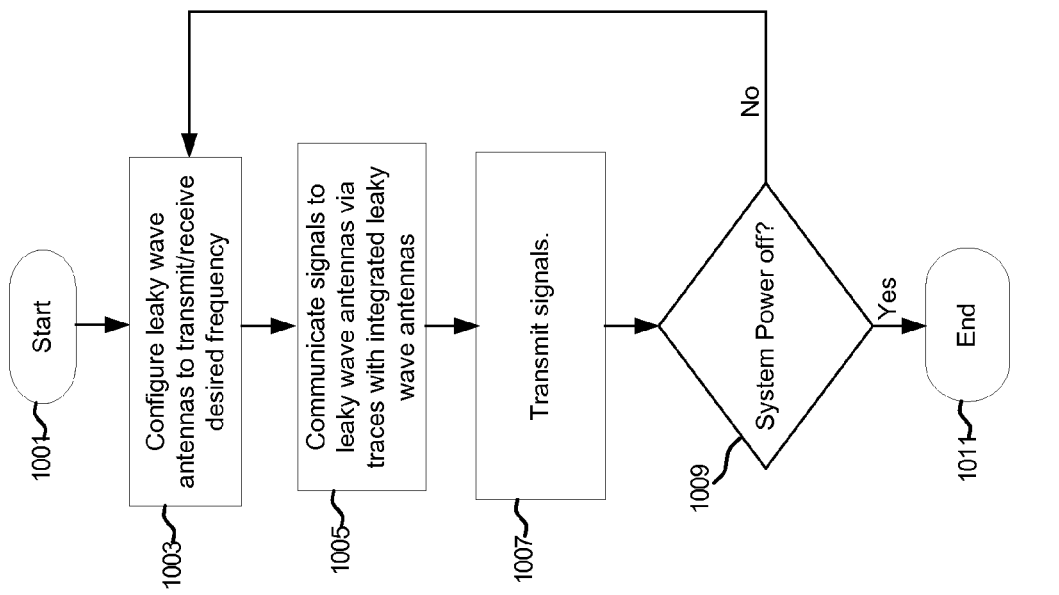
FIG. 10 is a block diagram illustrating exemplary steps for leaky wave antennas integrated in metal traces on a chip, package, and/or printed circuit board, in accordance with an embodiment of the invention.

FIG. 10 is a block diagram illustrating exemplary steps for leaky wave antennas integrated in metal traces on a chip, package, and/or printed circuit board, in accordance with an embodiment of the invention. Referring to FIG. 10, in step 1003 after start step 1001, one or more leaky wave antennas integrated in metal traces on a chip, package, and/or printed circuit board may be configured for a desired frequency via MEMS deflection, for example, or may adjust the Q of the cavity via shorting and/or opening slots or patches in the partially reflective surface. In step 1005, high frequency signals may be communicated to the leaky wave antennas via the traces that also may supply bias voltages, ground, and/or low frequency signals. In step 1007, the high frequency signals may be transmitted. In step 1009, in instances where the wireless device 150 is to be powered down, the exemplary steps may proceed to end step 1011. In step 1009, in instances where the wireless device 150 is not to be powered down, the exemplary steps may proceed to step 1003 to configure the leaky wave antenna at a desired frequency.

In an embodiment of the invention, a method and system are disclosed for transmitting and/or receiving RF signals comprising information using one or more or more leaky wave antennas 164A-164C, 400, 420, 600, and/or 903A-903G in a wireless device 150. The one or more leaky wave antennas 164A-164C, 400, 420, 600, and/or 903A-903G may be integrated in metal traces 723, 725, 731, 733, 801A-801F, and/or 905A-905D on one or more of: a chip 162, a package 167, and a printed circuit board 171. The metal traces 723, 725, 731, 733, 801A-801F, and/or 905A-905D may supply voltage signals to one or more circuits 901A-901F on the chip 162, package 167, and/or printed circuit board 171. The voltage signals may comprise DC bias voltages, and/or may comprise signals at a frequency that is lower than a resonant frequency of the leaky wave antennas 164A-164C, 400, 420, 600, 903A-903G. The leaky wave antennas 164A-164C, 400, 420, 600, and/or 903A-903G may comprise microstrip lines 720 where a cavity height of the leaky wave antennas 164A-164C, 400, 420, 600, and/or 903A-903G is dependent on a spacing between the microstrip lines 720. The leaky wave antennas 164A-164C, 400, 420, 600, and/or 903A-903G may comprise coplanar lines 730 where a cavity height of the leaky wave antennas 164A-164C, 400, 420, 600, and/or 903A-903G may be dependent on a spacing between the coplanar lines 730. The RF signals may comprise 60 GHz signals. An angle of the transmitting and/or receiving of the wireless signals with a surface of the chip 162, package 167, and/or printed circuit board 171 may be dynamically configured. The chip 162 may be affixed to the package 167 that is affixed to the printed circuit board 171. The leaky wave antennas 164A-164C, 400, 420, 600, and/or 903A-903G may be configured by switches 165A-165C integrated in the chip 162, package 167, and/or printed circuit board 171.

Another embodiment of the invention may provide a machine and/or computer readable storage and/or medium, having stored thereon, a machine code and/or a computer program having at least one code section executable by a machine and/or a computer, thereby causing the machine and/or computer to perform the steps as described herein for a 60 GHz leaky wave high gain antenna.

Accordingly, aspects of the invention may be realized in hardware, software, firmware or a combination thereof. The invention may be realized in a centralized fashion in at least one computer system or in a distributed fashion where different elements are spread across several interconnected computer systems. Any kind of computer system or other apparatus adapted for carrying out the methods described herein is suited. A typical combination of hardware, software and firmware may be a general-purpose computer system with a computer program that, when being loaded and executed, controls the computer system such that it carries out the methods described herein.

One embodiment of the present invention may be implemented as a board level product, as a single chip, application specific integrated circuit (ASIC), or with varying levels integrated on a single chip with other portions of the system as separate components. The degree of integration of the system will primarily be determined by speed and cost considerations. Because of the sophisticated nature of modern processors, it is possible to utilize a commercially available processor, which may be implemented external to an ASIC implementation of the present system. Alternatively, if the processor is available as an ASIC core or logic block, then the commercially available processor may be implemented as part of an ASIC device with various functions implemented as firmware.

The present invention may also be embedded in a computer program product, which comprises all the features enabling the implementation of the methods described herein, and which when loaded in a computer system is able to carry out these methods. Computer program in the present context may mean, for example, any expression, in any language, code or notation, of a set of instructions intended to cause a system having an information processing capability to perform a particular function either directly or after either or both of the following: a) conversion to another language, code or notation; b) reproduction in a different material form. However, other meanings of computer program within the understanding of those skilled in the art are also contemplated by the present invention.

While the invention has been described with reference to certain embodiments, it will be understood by those skilled in the art that various changes may be made and equivalents may be substituted without departing from the scope of the present invention. In addition, many modifications may be made to adapt a particular situation or material to the teachings of the present invention without departing from its scope. Therefore, it is intended that the present invention not be limited to the particular embodiments disclosed, but that the present invention will include all embodiments falling within the scope of the appended claims.

What is claimed is:

1. A method for communication, the method comprising: communicating RF signals using one or more leaky wave antennas in a wireless device comprising:
   a plurality of circuit blocks, each electrically connected to an adjacent circuit block by a plurality of metallic traces; and
   said one or more leaky wave antennas utilizing said plurality of metallic traces as a resonance cavity, wherein:
      said one or more leaky wave antennas are separate from said plurality of circuit blocks;
      said metal traces supply voltage signals between said plurality of circuit blocks.

2. The method according to claim 1, wherein said voltage signals comprise DC bias voltages.

3. The method according to claim 1, wherein said voltage signals comprise signals at a frequency that is lower than a resonant frequency of said leaky wave antennas.

4. The method according to claim 1, wherein said leaky wave antennas comprise microstrip lines.

5. The method according to claim 4, wherein a cavity height of said leaky wave antennas is dependent on a spacing between said microstrip lines.

6. The method according to claim 1, wherein said leaky wave antennas comprise coplanar lines.

7. The method according to claim 6, wherein a cavity height of said leaky wave antennas is dependent on a spacing between said coplanar lines.

8. The method according to claim 1, wherein said RF signals comprise 60 GHz signals.

9. The method according to claim comprising dynamically configuring an angle of said communicating of said wireless signals with a surface of said chip, said package, and/or said printed circuit board.

10. The method according to claim comprising configuring said one or more leaky wave antennas via switches in said chip, said package, and/or said printed circuit board.

11. A system for enabling communication, the system comprising:
   a wireless device comprising:
      a plurality of circuit blocks, each electrically connected to an adjacent circuit block by a plurality of metallic traces; and
      one or more leaky wave antennas utilizing said plurality of metallic traces as a resonance cavity, wherein:
         said one or more leaky wave antennas are separate from said plurality of circuit blocks;
         said metal traces supply voltage signals between said plurality of circuit blocks;
         said one or more leaky wave antennas being configured to communicate RF signals.

12. The system according to claim 11, wherein said voltage signals comprise DC bias voltages.

13. The system according to claim 11, wherein said voltage signals comprise signals at a frequency lower than a resonant frequency of said leaky wave antennas.

14. The system according to claim 11, wherein said leaky wave antennas comprise microstrip lines.

15. The system according to claim 11, wherein a cavity height of said leaky wave antennas is dependent on a spacing between said microstrip lines.

16. The system according to claim 11, wherein said leaky wave antennas comprise coplanar lines.

17. The system according to claim 11, wherein a cavity height of said leaky wave antennas is dependent on a spacing between said coplanar lines.

18. The system according to claim 11, wherein said RF signals comprise 60 GHz signals.

19. The system according to claim 11, wherein said plurality of circuit blocks are configured to dynamically configure an angle of said communicating of said wireless signals with a surface of said chip, package, and/or printed circuit board.

20. The system according to claim 11, wherein said plurality of circuit blocks are configured to configure said one or more leaky wave antennas via switches in said chip, said package, and/or said printed circuit board.

* * * * *

UNITED STATES PATENT AND TRADEMARK OFFICE
CERTIFICATE OF CORRECTION

PATENT NO.        : 8,743,002 B2                                    Page 1 of 1
APPLICATION NO.   : 12/708366
DATED             : June 3, 2014
INVENTOR(S)       : Ahmadreza Rofougaran It is certified that error appears in the above-identified patent and that said Letters Patent is hereby corrected as shown below:

Title page, item [57] Abstract, line 3, delete "or more"

In the Claims

Column 15, line 43, Claim 9, insert --1--, after according to claim

Column 16, line 1, Claim 10, insert --1--, after according to claim

Signed and Sealed this
Sixteenth Day of December, 2014

Michelle K. Lee
*Deputy Director of the United States Patent and Trademark Office*